(12) United States Patent
Yuen

(10) Patent No.: US 10,170,889 B1
(45) Date of Patent: Jan. 1, 2019

(54) CONTROLLING UNIFORMITY OF LATERAL OXIDATION OF WAFER SURFACE FEATURES USING A VERTICAL STACK OF HORIZONTAL WAFERS

(71) Applicant: Lumentum Operations LLC, Milpitas, CA (US)

(72) Inventor: Albert Yuen, Palo Alto, CA (US)

(73) Assignee: Lumentum Operations LLC, Milpitas, CA (US)

( * ) Notice: Subject to any disclaimer, the term of this patent is extended or adjusted under 35 U.S.C. 154(b) by 0 days.

(21) Appl. No.: 15/676,357

(22) Filed: Aug. 14, 2017

(51) Int. Cl.
| | |
|---|---|
| *H01L 21/31* | (2006.01) |
| *H01S 5/183* | (2006.01) |
| *H01L 21/02* | (2006.01) |
| *H01S 5/042* | (2006.01) |
| *H01S 5/187* | (2006.01) |
| *H01S 5/343* | (2006.01) |

(52) U.S. Cl.
CPC .... *H01S 5/18311* (2013.01); *H01L 21/02233* (2013.01); *H01S 5/0425* (2013.01); *H01S 5/187* (2013.01); *H01S 5/343* (2013.01)

(58) Field of Classification Search
CPC ...... H01S 5/18311; H01S 5/343; H01S 5/187; H01S 5/0425; H01L 21/02233
USPC ........................................................ 438/778
See application file for complete search history.

(56) References Cited

U.S. PATENT DOCUMENTS

| | | | | |
|---|---|---|---|---|
| 5,080,039 | A * | 1/1992 | Kanegae | C23C 16/46 118/715 |
| 5,493,577 | A * | 2/1996 | Choquette | H01L 33/105 257/E33.069 |
| 6,372,663 | B1* | 4/2002 | Yeh | H01L 21/31662 257/E21.285 |
| 6,650,683 | B2* | 11/2003 | Ueki | H01S 5/18394 372/46.01 |
| 7,330,494 | B1* | 2/2008 | Jewell | H01S 5/22 257/E33.069 |
| 7,885,307 | B2* | 2/2011 | Tanabe | H01S 5/1835 372/45.01 |
| 2010/0035440 | A1* | 2/2010 | Fukuda | H01L 21/02238 438/765 |
| 2013/0017503 | A1* | 1/2013 | De Ridder | F27B 17/0025 432/18 |

OTHER PUBLICATIONS

Wikipedia, "Thermal oxidation", https://en.wikipedia.org/wiki/Thermal_oxidation#Oxidation_technology, Jun. 26, 2017, 4 pages.

* cited by examiner

*Primary Examiner* — Vu A Vu
(74) *Attorney, Agent, or Firm* — Harrity & Harrity, LLP

(57) ABSTRACT

In some implementations, a method may include introducing oxygen into a furnace that contains a vertical stack of horizontal wafers. The oxygen may enter the furnace at a location above the vertical stack. A patterned wafer, included in the vertical stack, may include one or more surface features, and a surface feature, of the one or more surface features, may include one or more layers capable of being oxidize. The method may include causing lateral oxidation of at least one layer, of the one or more layers, based on introducing the oxygen into the furnace.

20 Claims, 5 Drawing Sheets

300 ⟶

310 — Introduce oxygen into a furnace that contains a vertical stack of horizontal wafers, wherein the oxygen enters the furnace at a location above the vertical stack, wherein a patterned wafer, included in the vertical stack, includes one or more surface features, and wherein a surface feature, of the one or more surface features, includes one or more layers capable of being oxidized 320 — Cause lateral oxidation of at least one layer, of the one or more layers, based on introducing the oxygen into the furnace

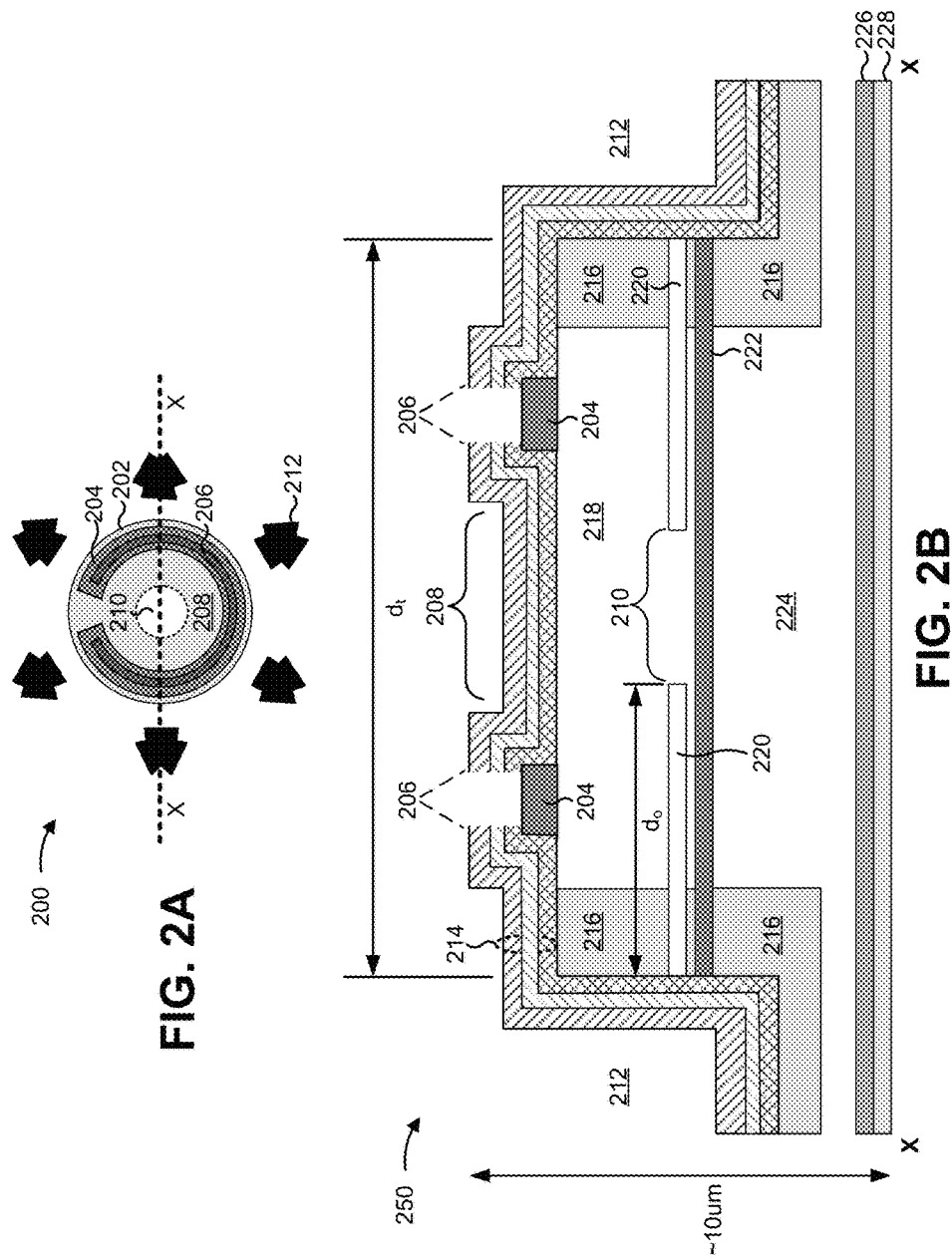

US 10,170,889 B1

CONTROLLING UNIFORMITY OF LATERAL OXIDATION OF WAFER SURFACE FEATURES USING A VERTICAL STACK OF HORIZONTAL WAFERS

TECHNICAL FIELD

The present disclosure relates generally to wafer fabrication and, more particularly, to wafer fabrication for lasers, such as by controlling uniformity of lateral oxidation of wafer surface features using a vertical stack of horizontal wafers.

BACKGROUND

A vertical-emitting device, such as a vertical-cavity surface-emitting laser (VCSEL), is a laser in which a laser beam is emitted in a direction perpendicular to a surface of a substrate (e.g., vertically from a surface of a semiconductor wafer). Contrary to edge-emitting devices, vertical-emitting devices may allow for testing to occur at intermediate steps of wafer fabrication.

SUMMARY

According to some possible implementations, a method may include introducing oxygen into a furnace that contains a vertical stack of horizontal wafers. The oxygen may enter the furnace at a location above the vertical stack. A patterned wafer, included in the vertical stack, may include one or more surface features, and a surface feature, of the one or more surface features, may include one or more layers capable of being oxidized. The method may include causing lateral oxidation of at least one layer, of the one or more layers, based on introducing the oxygen into the furnace.

According to some possible implementations, a method may include introducing oxygen into a furnace that contains a plurality of wafers that are oriented horizontally and stacked vertically with space between adjacent wafers. The oxygen may enter the furnace above the plurality of wafers. A wafer, of the plurality of wafers, may include a first feature on a central portion of the wafer and a second feature on an edge portion of the wafer. The method may include causing lateral oxidation of a first layer of the first feature and a second layer of the second feature based on introducing the oxygen into the furnace. The second layer may correspond to the first layer, and a first depth of lateral oxidation of the first layer may be substantially the same as a second depth of lateral oxidation of the second feature.

According to some possible implementations, a wafer may include a first surface feature located near the center of the wafer. The first surface feature may include a first layer that has been laterally oxidized to a first depth. The wafer may include a second surface feature located near the edge of the wafer. The second surface feature may include a second layer, corresponding to the first layer, that has been laterally oxidized to a second depth. The second depth may be substantially the same as the first depth.

BRIEF DESCRIPTION OF THE DRAWINGS

FIGS. 2A and 2B are diagrams depicting a top-view of an example emitter and an example cross-sectional view of the example emitter, respectively;

DETAILED DESCRIPTION

The following detailed description of example implementations refers to the accompanying drawings. The same reference numbers in different drawings may identify the same or similar elements. The implementations described below are merely examples and are not intended to limit the implementations to the precise forms disclosed. Instead, the implementations were selected for description to enable one of ordinary skill in the art to practice the implementations.

Figure 1A:
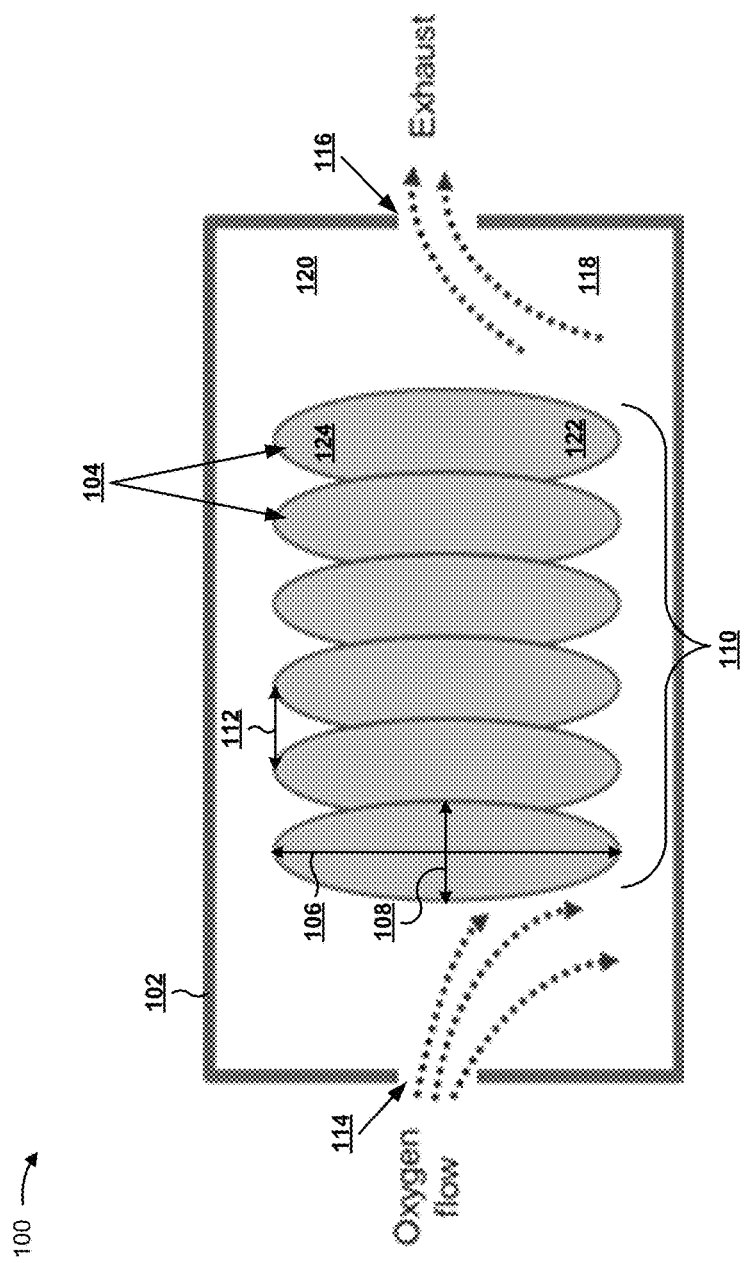
FIG. 1A is a diagram of an example wafer fabrication process that uses a horizontal stack of vertically oriented wafers.

FIG. 1A is a diagram of an example 100 of a wafer fabrication process that uses a horizontal stack of vertically oriented wafers.

As shown in FIG. 1A, a furnace 102 may contain a plurality of wafers 104. The plurality of wafers 104 may be vertically oriented, such that a diameter 106 of a surface of a wafer 104 (e.g., a surface that includes features) extends vertically (e.g., parallel with gravitational pull) and a thickness 108 of the wafer 104 extends horizontally (e.g., perpendicular to gravitational pull). The wafers 104 may be stacked in a horizontal stack 110, with space 112 between adjacently stacked wafers 104. In some implementations, the furnace 102 may be a horizontal furnace (e.g., with a larger width than height). One implementation is a long horizontal quartz tube with a gas inlet on one end of the tube and a gas outlet at the other end of the tube. Wafers are placed vertically along the axis of the tube to maximize the number of wafers processed in each operation.

In this arrangement, oxygen may be introduced into the furnace 102 from one end 114 of the horizontal stack 110, and/or may exit the furnace 102 from an opposite end 116 of the horizontal stack 110. The oxygen may sink to the bottom of the furnace 102 because the oxygen is heavier than other gases in the furnace 102, such as nitrogen, air, an air mixture, and/or the like. The oxygen may take a relatively long amount of time (e.g., several minutes) to fill the entire furnace 102. Thus, oxygen may be present in a lower portion 118 of the furnace 102 for a longer time than an upper portion 120 of the furnace 102. This non-uniform presence of oxygen in different portions of the furnace 102 causes non-uniformity in oxidation across different portions of a wafer 104 (e.g., when the wafers 104 are heated in the furnace 102 before oxygen is introduced into the furnace 102). For example, lateral oxidation of a feature on a lower portion 122 of a wafer 104 may occur for a longer time than lateral oxidation of a feature on an upper portion 124 of a wafer 104, causing deeper lateral oxidation of features on the lower portion 122 and shallower lateral oxidation of features on the upper portion 124.

When features are to be designed according to a particular specification, such as lateral oxidation to a particular depth or a resulting aperture of a particular width, the non-uniformity in oxidation across a wafer results in a low yield of features that satisfy the specification. For example, when different features on a wafer 104 are laterally oxidized to different depths, causing non-uniform aperture sizes, some features may have an aperture size that meets the specification, and some may not.

In some cases, the wafers 104 may be oriented horizontally in the furnace 102, with the oxygen being introduced into the furnace 102 from one end 114 of the furnace 102 and/or exiting the furnace 102 from an opposite end 116 of the furnace 102. This arrangement may reduce the non-uniform oxidation issues described above, but such non-uniform oxidation may still occur due to turbulence of the oxygen as it enters, passes through, and exits the furnace 102. Furthermore, such an arrangement may result in low throughput because a relatively small number of wafers 104 may be placed in the furnace 102 and/or oxidized at the same time (e.g., in a single process run) as compared to the arrangement described below in connection with FIG. 1B.

Figure 1B:
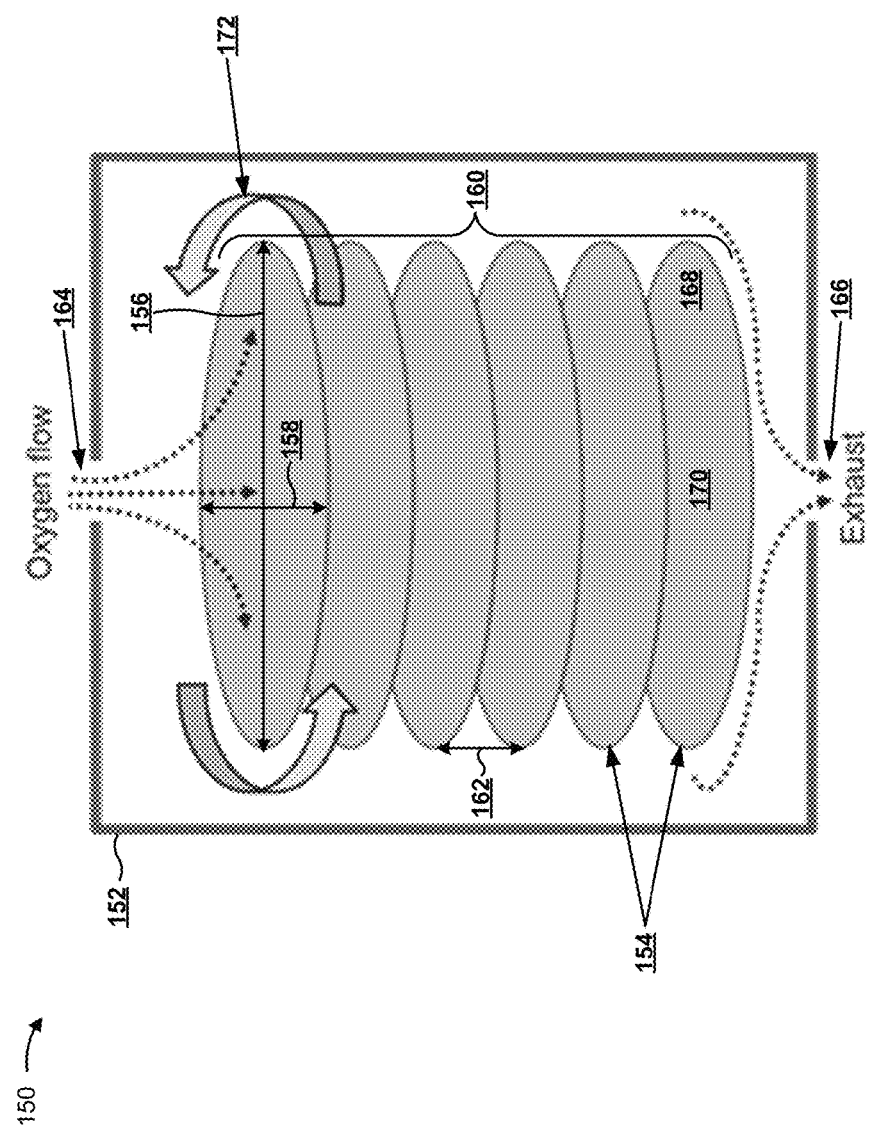
FIG. 1B is a diagram of an example wafer fabrication process that uses a vertical stack of horizontally oriented wafers.

FIG. 1B is a diagram of an example 150 of a wafer fabrication process that uses a vertical stack of horizontally oriented wafers.

As shown in FIG. 1B, a furnace 152 may contain a plurality of wafers 154. The plurality of wafers 154 may be horizontally oriented, such that a diameter 156 of a surface of a wafer 154 (e.g., a surface that includes features) extends horizontally (e.g., perpendicular to gravitational pull) and a thickness 158 of the wafer 154 extends vertically (e.g., parallel with gravitational pull). The wafers 154 may be stacked in a vertical stack 160, with space 162 between adjacently stacked wafers 154. In some implementations, the wafers 154 may be stacked in a quartz boat in a relatively temperature flat zone of the furnace 152. In some implementations, the furnace 152 may be a vertical furnace (e.g., with a larger height than width), which is typically a tall quartz tube with a gas inlet near the top and a gas outlet near the bottom. Typically, the ratio of height vs. width of a vertical furnace is greater than 1. In some implementations, a wafer 154 may be a GaAs wafer that has an epitaxially grown structure on a top surface of the wafer 154 that is subsequently processed with one or more patterns to allow oxidation.

In this arrangement, oxygen (e.g., in the form of steam, water vapor, $H_2O$, $O_2$, dry oxygen, wet oxygen, and/or the like) may be introduced into the furnace 152 from a location 164 above the vertical stack 160. Additionally, or alternatively, oxygen may exit the furnace 152 at another location 166 below the vertical stack 160. Due to the combination of flow and gravitational pull, the oxygen may sink to the bottom of the furnace 152, and may fill the entire furnace 152 in a relatively short amount of time (e.g., a few seconds) to fill the entire furnace 152 (e.g., as compared to the arrangement described above in connection with FIG. 1A). Thus, oxygen may be uniformly present throughout the furnace 152, which results in uniformity in oxidation across different portions of a wafer 154 and/or across different wafers 154. For example, oxygen may uniformly fill the furnace 152 more quickly than the furnace 102. Furthermore, in the furnace 152, oxygen may fill the space between the wafers 154 more quickly than the furnace 102 (e.g., within seconds). This uniform filling may be sped up even more by reducing pressure in the furnace 152 (e.g., via vacuum pumping) prior to introducing the oxygen.

For example, lateral oxidation of a feature on an edge portion 168 of a wafer 154 (e.g., a portion within a threshold distance of an edge of the wafer 154, such as less than 0.5 inches, less than one inch, less than two inches, and/or the like) may be substantially the same as (e.g., substantially uniform with) lateral oxidation of a feature on a central portion 170 of the wafer 154 (e.g., a portion within a threshold distance of the center of the wafer 154, such as less than 0.5 inches, less than one inch, less than two inches, and/or the like). This may cause lateral oxidation to a substantially similar depth on features positioned throughout the wafer 154 (e.g., within a threshold tolerance, such as ±0.4 microns, ±0.3 microns, ±0.25 microns, ±0.2 microns, and/or the like). For example, a first depth of lateral oxidation of a first feature located in the central portion 170 (e.g., a first feature located closest to a center of the wafer 154) may be substantially the same as a second depth of lateral oxidation of a second feature located in the edge portion 168 (e.g., a second feature located closest to an edge of the wafer 154). In some implementations, the difference between the first depth and the second depth may be 0.8 microns or less, 0.6 microns or less, 0.5 microns or less, 0.4 microns or less, and/or the like for the lateral oxidation to be considered substantially the same.

In some implementations, the lateral oxidation may be substantially uniform (e.g., as described above) for a threshold percentage of features on a wafer 154. For example, the lateral oxidation may be substantially uniform across 75% or more of the features on the wafer 154, across 80% or more of the features on the wafer 154, across 85% or more of the features on the wafer 154, across 90% or more of the features on the wafer 154, across 95% or more of the features on the wafer 154, across 100% of the features (e.g., all features) on the wafer 154, and/or the like. Additionally, or alternatively, the lateral oxidation may be substantially uniform for a threshold percentage (e.g., the threshold percentages indicated above) of features across all wafers 154 in the vertical stack 160. In some implementations, the lateral oxidation may be substantially uniform for all features of all wafers 154 included in the vertical stack 160.

As used herein, a comparison of lateral oxidation on multiple features (e.g., for uniformity, for satisfying a threshold, and/or the like) may refer to a comparison of a depth of lateral oxidation of corresponding layers on the multiple features. For example, a first layer of a first feature and a second layer of a second feature may be laterally oxidized. In this case, the first layer may correspond to the second layer. For example, the first layer may be a same type of layer as the second layer (e.g., an oxidation layer, as described below in connection with FIG. 2B). Additionally, or alternatively, the first layer may be made of substantially the same material and/or may have substantially the same composition as the second layer (e.g., within a threshold impurity tolerance). For example, the corresponding layers may be composed primarily of aluminum, in some implementations.

When features are to be designed according to a particular specification, such as lateral oxidation to a particular depth or a resulting aperture of a particular width, the uniformity in oxidation may result in a high yield of features that satisfy the specification. For example, when different features on a wafer 154 are laterally oxidized to the same depth, causing uniform aperture sizes, all of the features may have an aperture size that meets the specification (or a greater number of features may have an aperture that meets the specification as compared to the arrangement described above in connection with FIG. 1A). Furthermore, the arrangement shown in FIG. 1B may result in high throughput because a relatively large number of wafers 154 may be placed in the furnace 152 and/or oxidized at the same time (e.g., in a single process run) as compared to the arrangement described above in connection with FIG. 1A.

As shown by reference number 172, in some implementations, the vertical stack 160 of wafers 154 may be rotated. For example, the vertical stack 160 may be rotated during lateral oxidation. Additionally, or alternatively, the vertical stack 160 may be rotated as oxygen enters, passes through, and/or exits the furnace 152. The rotation may be around an axis that extends through the center of each wafer 154 in the vertical stack 160 in a direction perpendicular to gravitational pull. The rotation may be at a rate of, for example, one rotation per minute, two rotations per minute, less than one rotation per minute, and/or the like. This rotation may result in further uniformity in oxidation.

In some implementations, a wafer 154 may be a patterned wafer. For example, the wafer 154 may include one or more features (e.g., which may be referred to as a feature or a surface feature). In some implementations, a feature may include an emitter (e.g., a VCSEL), a set of emitter layers (e.g., epitaxial layers of the emitter), and/or the like, as described below in connection with FIGS. 2A and 2B. Additionally, or alternatively, a feature may include a trench (e.g., an etched trench), a mesa, and/or the like. In some implementations, a feature may include one or more layers capable of being oxidized, and the introduction of oxygen into the furnace 152 may cause lateral oxidation of at least one layer of the feature.

In some implementations, the lateral oxidation may form an aperture for electrical confinement in the feature. Additionally, or alternatively, the lateral oxidation may form an aperture for optical confinement in the feature. For example, the feature may be a VCSEL, and the lateral oxidation may form an aperture for electrical confinement and/or optical confinement in the VCSEL. In this way, a high yield and high throughput of features (e.g., VCSELs) that satisfy a constraint or specification (e.g., an oxide aperture with a particular width within a tolerance range) may be produced using the arrangement shown in FIG. 1B.

As indicated above, FIGS. 1A and 1B are provided as examples. Other examples are possible and may differ from what was described in connection with FIGS. 1A and 1B.

FIGS. 2A and 2B are diagrams depicting a top-view of an emitter 200 and an example cross-sectional view 250 of emitter 200, respectively. As shown in FIG. 2A, emitter 200 may include a set of emitter layers constructed in a typical emitter architecture. For purposes of clarity, not all emitter layers of emitter 200 are shown in FIG. 2A. In some implementations, the emitter 200 may be a feature of a wafer 154, as described above in connection with FIG. 1B.

As shown in FIG. 2A, emitter 200 includes an implant protection layer 202 that is circular in shape in this example. In some implementations, implant protection layer 202 may have another shape, such as an elliptical shape, a polygonal shape, or the like. Implant protection layer 202 is defined based on a space between sections of implant material included in emitter 200 (not shown). As shown by the medium gray area in FIG. 2A, emitter 200 includes a P-Ohmic metal layer 204 that is constructed in a partial ring-shape (e.g., with an inner radius and an outer radius). As shown, P-Ohmic metal layer 204 is positioned concentrically over implant protection layer 202 (i.e., the outer radius of P-Ohmic metal layer 204 is less than or equal to the radius of implant protection layer 202). Such configuration may be used, for example, in the case of a P-up/top-emitting emitter 200. In the case of a bottom-emitting emitter 200, the configuration may be adjusted as needed.

As further shown in FIG. 2A, emitter 200 includes a dielectric via opening 206 that is formed (e.g., etched) on a dielectric passivation/mirror layer that covers P-Ohmic metal layer 204 (not shown). As shown, dielectric via opening 206 is formed in a partial ring-shape (e.g., similar to P-Ohmic metal layer 204) and is formed concentrically over P-Ohmic metal layer 204 such that metallization of the dielectric passivation/mirror layer contacts P-Ohmic metal layer 204. In some implementations, dielectric opening 206 and/or P-Ohmic metal layer 204 may be formed in another shape, such as a full ring-shape or a split ring-shape.

As further shown, emitter 200 includes an optical aperture 208 in a portion of the emitter within the inner radius of the partial ring-shape of P-Ohmic metal layer 204. Emitter 200 emits a laser beam via optical aperture 208. As further shown, emitter 200 also includes a current confinement aperture 210 (e.g., an oxide aperture formed by an oxidation layer of emitter 200 (not shown)). Current confinement aperture 210 is formed below optical aperture 208. In some implementations, the arrangement described above in connection with FIG. 1B may be used to control uniformity in multiple current confinement apertures 210 in different emitters 200 on a single wafer 154. Additionally, or alternatively, the arrangement described above in connection with FIG. 1B may be used to control uniformity in multiple current confinement apertures 210 in different emitters 200 on different wafers 154.

As further shown in FIG. 2A, emitter 200 includes a set of oxidation trenches 212 that are spaced (e.g., equally, unequally) around a circumference of implant protection layer 202. How close oxidation trenches 212 can be positioned relative to the optical aperture 208 is dependent on the application, and is typically limited by implant protection layer 202, P-Ohmic metal layer 204, dielectric via opening 206, and manufacturing tolerances.

The number and arrangement of layers shown in FIG. 2A are provided as an example. In practice, emitter 200 may include additional layers, fewer layers, different layers, or differently arranged layers than those shown in FIG. 2A. For example, while emitter 200 includes a set of six oxidation trenches 212, in practice, other designs are possible, such as a compact emitter that includes five oxidation trenches 212, seven oxidation trenches 212, or the like. As another example, while emitter 200 is a circular emitter design, in practice, other designs are possible, such as a rectangular emitter, a hexagonal emitter, an elliptical emitter, or the like. Additionally, or alternatively, a set of layers (e.g., one or more layers) of emitter 200 may perform one or more functions described as being performed by another set of layers of emitter 200, respectively.

Notably, while the design of emitter 200 is described as including a VCSEL, other implementations are possible. For example, the design of emitter 200 may apply in the context of another type of optical device, such as a photodetector, an edge emitting laser, a heterojunction bipolar transistor, a light emitting diode (LED), a vertical emitting optical device (e.g., a top emitting optical device or a bottom emitting optical device), or any other semiconductor device that uses lateral oxidation. Additionally, the design of emitter 200 may apply to emitters of any wavelength, power level, emission profile, or the like. In other words, emitter 200 is not particular to an emitter with a given performance characteristic.

As shown in FIG. 2B, the example cross-sectional view may represent a cross-section of emitter 200 that passes through a pair of oxidation trenches 212 (e.g., as shown by the line labeled "X-X" in FIG. 2A). As shown, emitter 200 may include a backside cathode layer 228, a substrate layer 226, a bottom mirror 224, an active region 222, an oxidation layer 220, a top mirror 218, an implant isolation material 216, a dielectric passivation/mirror layer 214, and a P-Ohmic metal layer 204. As shown, emitter 200 may have a total height that is approximately 10 μm.

Backside cathode layer 228 may include a layer that makes electrical contact with substrate layer 226. For example, backside cathode layer 228 may include an annealed metallization layer, such as an AuGeNi layer, a PdGeAu layer, or the like.

Substrate layer 226 may include a base substrate layer upon which epitaxial layers are grown. For example, substrate layer 226 may include a semiconductor layer, such as a GaAs layer, an InP layer, and/or the like.

Bottom mirror 224 may include a bottom reflector layer of emitter 200. For example, bottom mirror 224 may include a distributed Bragg reflector (DBR).

Active region 222 may include a layer that confines electrons and defines an emission wavelength of emitter 200. For example, active region 222 may be a quantum well.

Oxidation layer 220 may include an oxide layer that provides optical and electrical confinement of emitter 200. In some implementations, oxidation layer 220 may be formed as a result of wet oxidation of an epitaxial layer. For example, oxidation layer 220 may be an $Al_2O_3$ layer formed as a result of oxidation of an AlAs or AlGaAs layer. Oxidation trenches 212 may include openings that allow oxygen (e.g., dry oxygen, wet oxygen) to access the epitaxial layer from which oxidation layer 220 is formed, such as by introducing the oxygen to a furnace 152 as described above in connection with FIG. 1B. As shown, oxidation layer 220 may be laterally oxidized from opposing oxidation trenches 212. In some implementations, a depth do of the lateral oxidation (e.g., from the opposing oxidation trenches 212) may define a width of current confinement aperture 210.

Current confinement aperture 210 may include an optically active aperture defined by oxidation layer 220. A size of current confinement aperture 210 may range, for example, from approximately 6.0 μm to approximately 14.0 μm. In some implementations, a size of current confinement aperture 210 may depend on a distance between oxidation trenches 212 that surround emitter 200 and on a distance between oxidation layers 220. For example, oxidation trenches 212 may be etched to expose the epitaxial layer from which oxidation layer 220 is formed. Here, before dielectric passivation/mirror layer 214 is deposited, oxidation of the epitaxial layer may occur for a particular distance (e.g., identified as do in FIG. 2B) toward a center of emitter 200, thereby forming oxidation layer 220 and current confinement aperture 210. In some implementations, current confinement aperture 210 may include an oxide aperture. Additionally, or alternatively, current confinement aperture 210 may include an aperture associated with another type of current confinement technique, such as an etched mesa, a region without ion implantation, lithographically defined intra-cavity mesa and regrowth, or the like.

Top mirror 218 may include a top reflector layer of emitter 200. For example, top mirror 218 may include a DBR.

Implant isolation material 216 may include a material that provides electrical isolation. For example, implant isolation material 216 may include an ion implanted material, such as an H implanted material or a Hydrogen/Proton implanted material. In some implementations, implant isolation material 216 may define implant protection layer 202.

Dielectric passivation/mirror layer 214 may include a layer that acts as a protective passivation layer and that acts as an additional DBR. For example, dielectric passivation/ mirror layer 214 may include one or more sub-layers (e.g., a SiO2 layer, a Si3N4 layer) deposited (e.g., via chemical vapor deposition) on one or more other layers of emitter 200.

As shown, dielectric passivation/mirror layer 214 may include one or more dielectric via openings 206 that provide electrical access to P-Ohmic metal layer 204. Optical aperture 208 may include a portion of dielectric passivation/ mirror layer 214 over current confinement aperture 210 via which light may be emitted.

P-Ohmic metal layer 204 may include a layer that makes electrical contact via which electrical current may flow. For example, P-Ohmic metal layer 204 may include a TiAu layer, a TiPtAu layer, or the like, via which electrical current may flow (e.g., via a bondpad (not shown) that contacts P-Ohmic metal layer 204 through dielectric via openings 206).

In some implementations, emitter 200 may be manufactured using a series of steps. For example, bottom mirror 224, active region 222, oxidation layer 220, and top mirror 218 may be epitaxially grown on substrate layer 226, after which P-Ohmic metal layer 204 may be deposited on top mirror 218. Next, oxidation trenches 212 may be etched to expose oxidation layer 220 for oxidation, such as via process 300 of FIG. 3, process 400 of FIG. 4, and/or another process described herein (e.g., in connection with FIG. 1B). Implant isolation material 216 may be created via ion implantation, after which dielectric passivation/mirror layer 214 may be deposited. Dielectric via openings 206 may be etched in dielectric passivation/mirror layer 214 (e.g., to expose P-Ohmic metal layer for contact). Plating, seeding, and etching may be performed, after which substrate layer 226 may be thinned and/or lapped to a target thickness. Finally, backside cathode layer 228 may be deposited on a bottom side of substrate layer 226.

The number, arrangement, thicknesses, order, symmetry, or the like, of layers shown in FIG. 2B is provided as an example. In practice, emitter 200 may include additional layers, fewer layers, different layers, differently constructed layers, or differently arranged layers than those shown in FIG. 2B. Additionally, or alternatively, a set layers (e.g., one or more layers) of emitter 200 may perform one or more functions described as being performed by another set of layers of emitter 200.

Figure 3:
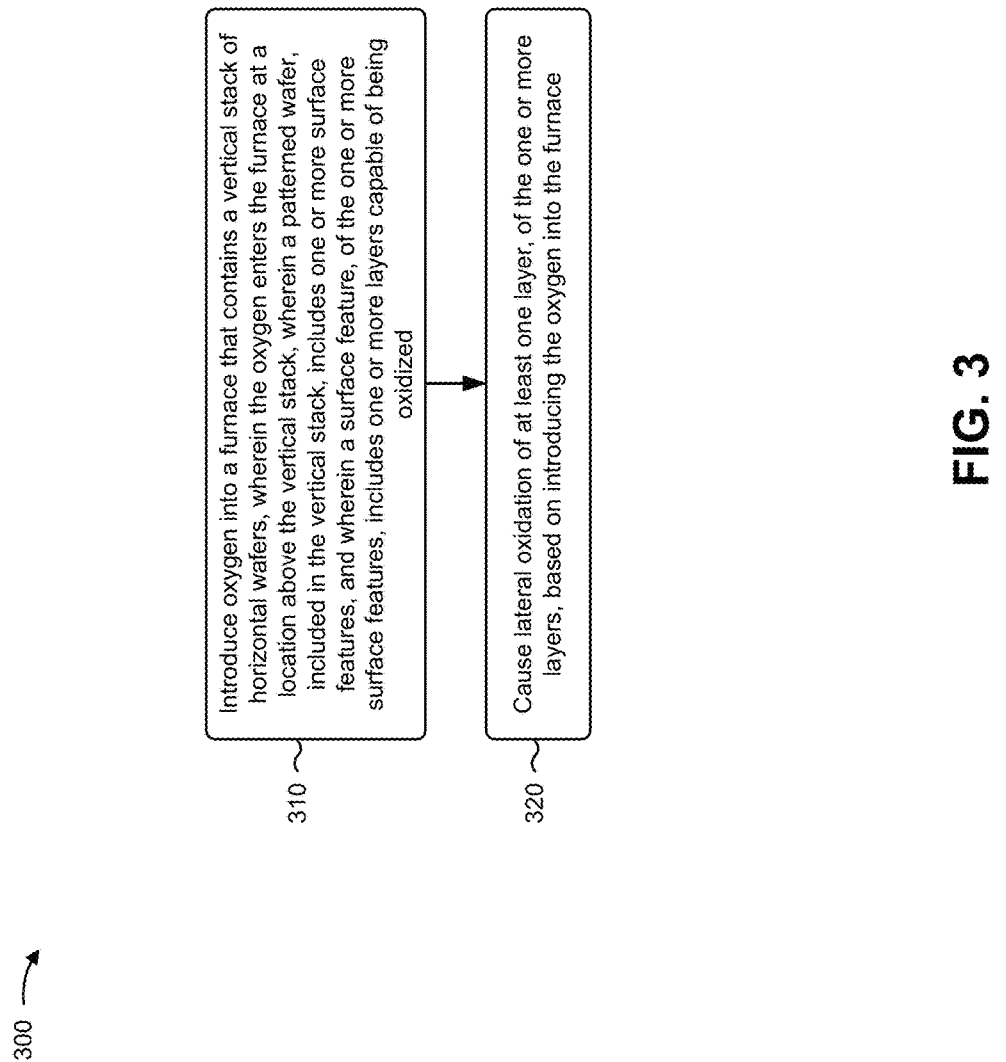
FIG. 3 is a flow chart of an example process described herein.

FIG. 3 is a flow chart of an example process 300 for wafer fabrication that controls uniformity of lateral oxidation of wafer surface features using a vertical stack of horizontal wafers.

As shown in FIG. 3, process 300 may include introducing oxygen into a furnace that contains a vertical stack of horizontal wafers (block 310). In some implementations, the oxygen enters the furnace at a location above the vertical stack. The location may be, for example, at a top of the furnace, on a side of the furnace, along a rotational axis of the vertical stack, and/or the like. Additionally, or alternatively, multiple locations (e.g., multiple openings) may be used to introduce the oxygen. In some implementations, a patterned wafer, included in the vertical stack, includes one or more surface features. In some implementations, a surface feature, of the one or more surface features, includes one or more layers capable of being oxidized.

As further shown in FIG. 3, process 300 may include causing lateral oxidation of at least one layer, of the one or more layers, based on introducing the oxygen into the furnace (block 320).

In some implementations, the oxygen exits the furnace at another location below the vertical stack. In some implementations, the vertical stack may be rotated during the lateral oxidation.

In some implementations, the lateral oxidation forms an aperture for electrical confinement in the surface feature. In some implementations, the lateral oxidation forms an aperture for optical confinement in the surface feature. In some implementations, the surface feature is a VCSEL. In some implementations, the lateral oxidation forms an oxide aperture for at least one of optical confinement or electrical confinement in the VCSEL.

In some implementations, the lateral oxidation of surface features on an edge portion of the patterned wafer are substantially uniform with the lateral oxidation of surface features on a central portion of the patterned wafer. In some implementations, the lateral oxidation of surface features on different wafers, included in the vertical stack, are substantially uniform. In some implementations, a first depth of lateral oxidation of a first surface feature located closest to a center of the patterned wafer is substantially the same as a second depth of lateral oxidation of a second surface feature located closest to an edge of the patterned wafer. In some implementations, a difference between the first depth and the second depth is 0.4 microns or less. In some implementations, the lateral oxidation is substantially uniform for all surface features on the patterned wafer. In some implementations, the lateral oxidation is substantially uniform for all surface features of all wafers included in the vertical stack. In some implementations, the furnace is a vertical furnace.

In some implementations, the wafers may be loaded into a quartz carrier as a vertical stack, and may be inserted into the furnace (e.g., at room temperature). The furnace chamber may then be pumped (e.g., vacuum pumped) to a lower pressure (e.g., 0.1 Torr and/or the like), and the heating elements of the furnace may be turned on to heat the wafers. In some implementations, the wafers may be heated in the furnace in the absence of oxygen, prior to oxygen being introduced into the furnace (e.g., above the vertical stack). When a threshold temperature is reached (e.g., 400 C and/or the like), the oxygen source may be turned on to introduce oxygen into the furnace above the vertical stack of wafers. After a set duration of oxidation time (e.g., determined based on a desired depth of lateral oxidation), the oxygen source may be turned off, and the chamber may be pumped out to remove any excess oxygen, and the heating element may be turned off. Once the temperature reaches a threshold (e.g., 30 C and/or the like), the chamber may be opened and the wafers removed. In some implementations, the chamber may not be vacuum pumped. Additionally, or alternatively, the chamber may be kept at a high temperature, and the wafers may be introduced into the chamber at a lower temperature and allowed to heat up to a threshold temperature (e.g., 400 C and/or the like) before the oxygen is introduced.

Although FIG. 3 shows example blocks of process 300, in some implementations, process 300 may include additional blocks, fewer blocks, different blocks, or differently arranged blocks than those depicted in FIG. 3. Additionally, or alternatively, two or more of the blocks of process 300 may be performed in parallel.

Figure 4:
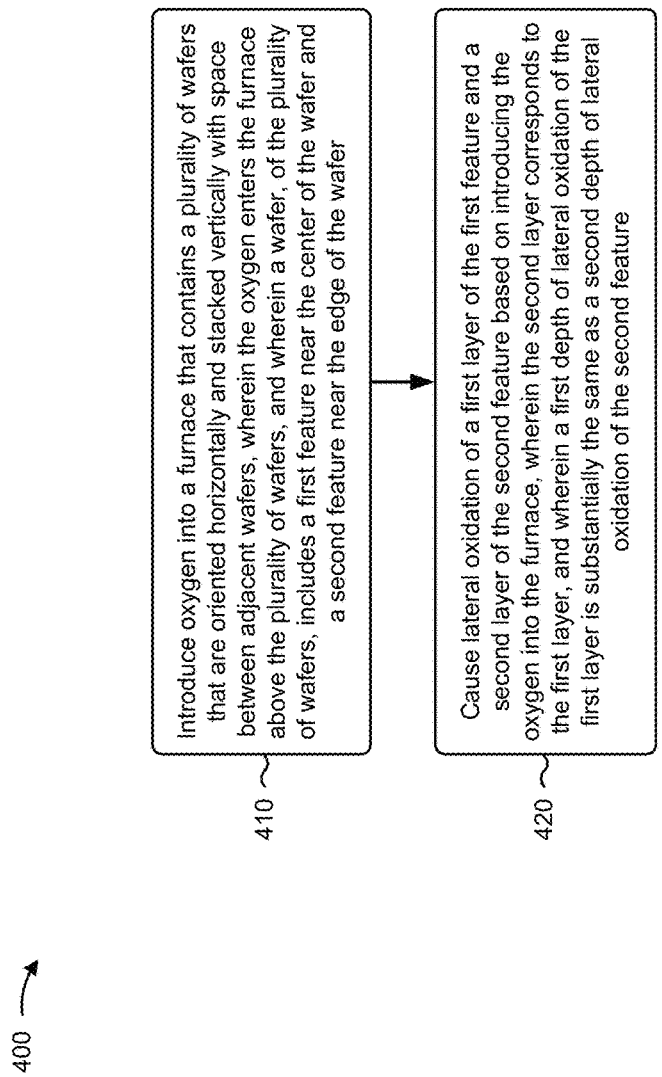
FIG. 4 is a flow chart of another example process described herein.

FIG. 4 is a flow chart of another example process 400 for wafer fabrication that controls uniformity of lateral oxidation of wafer surface features using a vertical stack of horizontal wafers.

As shown in FIG. 4, process 400 may include introducing oxygen into a furnace that contains a plurality of wafers that are oriented horizontally and stacked vertically with space between adjacent wafers (block 410). In some implementations, the oxygen enters the furnace above the plurality of wafers. In some implementations, a wafer, of the plurality of wafers, includes a first feature on a central portion of the wafer and a second feature on an edge portion of the wafer.

As further shown in FIG. 4, process 400 may include causing lateral oxidation of a first layer of the first feature and a second layer of the second feature based on introducing the oxygen into the furnace (block 420). In some implementations, the second layer corresponds to the first layer. In some implementations, a first depth of lateral oxidation of the first layer is substantially the same as a second depth of lateral oxidation of the second feature.

In some implementations, process 400 includes rotating the plurality of wafers during the lateral oxidation. In some implementations, the lateral oxidation forms a first aperture for optical confinement and electrical confinement in the first feature and a second aperture for optical confinement and electrical confinement in the second feature. In some implementations, a depth of lateral oxidation of corresponding layers on all (or a majority of) features on the wafer is substantially uniform. In some implementations, a depth of lateral oxidation of corresponding layers on a plurality of features on different wafers, of the plurality of wafers, is substantially uniform.

In some implementations, performing process 300 and/or process 400 may form a wafer (e.g., a fabricated wafer). The wafer may include a first surface feature located near the center of the wafer. The first surface feature may include a first layer that has been laterally oxidized to a first depth. The wafer may include a second surface feature located near the edge of the wafer. The second surface feature may include a second layer, corresponding to the first layer, that has been laterally oxidized to a second depth. The second depth may be substantially the same as the first depth.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Some implementations described herein may produce a high yield and a high throughput of features (e.g., VCSELs and/or the like), on one or more wafers, that satisfy a constraint. The constraint may include, for example, uniform lateral oxidation, uniform depth of lateral oxidation, formation of apertures with a width within a tolerance range, and/or the like.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A method, comprising:
   determining that a particular temperature of a furnace that contains a vertical stack of horizontal wafers is satisfied;
   introducing, based on determining that the particular temperature of the furnace is satisfied, oxygen into the furnace,
      wherein the oxygen enters the furnace at a location above the vertical stack,
      wherein a patterned wafer, included in the vertical stack, includes one or more surface features, and
      wherein a surface feature, of the one or more surface features, includes one or more layers capable of being oxidized; and
   causing lateral oxidation of at least one layer, of the one or more layers, based on introducing the oxygen into the furnace,
      wherein a difference between a first depth of lateral oxidation of a first surface feature, of the one or more surface features, and a second depth of lateral oxidation of a second surface feature, of the one or more surface features, is 0.4 microns or less, and
      wherein the first surface feature is located on a central portion of the patterned wafer and the second surface feature is located on an edge portion of the patterned wafer.

2. The method of claim 1, wherein the oxygen exits the furnace at another location below the vertical stack.

3. The method of claim 1, further comprising:
   rotating the vertical stack during the lateral oxidation.

4. The method of claim 1, wherein the lateral oxidation forms an aperture for electrical confinement in the surface feature.

5. The method of claim 1, wherein the lateral oxidation forms an aperture for optical confinement in the surface feature.

6. The method of claim 1, wherein the surface feature is a vertical-cavity surface-emitting laser (VCSEL).

7. The method of claim 6, wherein the lateral oxidation forms an oxide aperture for at least one of optical confinement or electrical confinement in the VCSEL.

8. The method of claim 1, wherein lateral oxidation of surface features on an edge portion of the patterned wafer are substantially uniform with lateral oxidation of surface features on a central portion of the patterned wafer.

9. The method of claim 8, wherein lateral oxidation of surface features on different wafers, included in the vertical stack, are substantially uniform.

10. The method of claim 1, wherein the lateral oxidation is substantially uniform for all surface features on the patterned wafer.

11. The method of claim 1, wherein the lateral oxidation is substantially uniform for all surface features of all wafers included in the vertical stack.

12. The method of claim 1, wherein the furnace is a vertical furnace.

13. A method, comprising:
   determining that a particular temperature of a furnace that contains a plurality of wafers that are oriented horizontally and stacked vertically with space between adjacent wafers is satisfied;
   introducing, based on determining that the particular temperature of the furnace is satisfied, oxygen into the furnace,
      wherein the oxygen enters the furnace above the plurality of wafers, and
      wherein a wafer, of the plurality of wafers, includes a first feature on a central portion of the wafer and a second feature on an edge portion of the wafer; and
   causing lateral oxidation of a first layer of the first feature and a second layer of the second feature based on introducing the oxygen into the furnace,
      wherein a difference between a first depth of lateral oxidation of the first feature and a second depth of lateral oxidation of the second feature is 0.4 microns or less.

14. The method of claim 13, further comprising:
   rotating the plurality of wafers during the lateral oxidation.

15. The method of claim 13, wherein the lateral oxidation forms a first aperture for optical confinement and electrical confinement in the first feature and a second aperture for optical confinement and electrical confinement in the second feature.

16. The method of claim 13, wherein a depth of lateral oxidation of corresponding layers on all features on the wafer is substantially uniform.

17. The method of claim 13, wherein a depth of lateral oxidation of corresponding layers on a plurality of features on different wafers, of the plurality of wafers, is substantially uniform.

18. The method of claim 13, wherein the lateral oxidation forms an aperture for at least one of electrical confinement in the first feature and the second feature or optical confinement in the first feature and the second feature.

19. The method of claim 13, wherein the first feature is a vertical-cavity surface-emitting laser (VCSEL).

20. The method of claim 13, wherein the oxygen exits the furnace at another location below the plurality of wafers.

* * * * *